(12) United States Patent
Gong

(10) Patent No.: US 10,862,017 B2
(45) Date of Patent: Dec. 8, 2020

(54) LIGHT-CONTROLLED SUPERCONDUCTOR

(71) Applicant: Bingxin Gong, Guangdong (CN)

(72) Inventor: Bingxin Gong, Guangdong (CN)

( * ) Notice: Subject to any disclaimer, the term of this patent is extended or adjusted under 35 U.S.C. 154(b) by 388 days.

(21) Appl. No.: 15/964,122

(22) Filed: Apr. 27, 2018

(65) Prior Publication Data

US 2018/0248102 A1 Aug. 30, 2018

Related U.S. Application Data

(63) Continuation of application No. PCT/CN2016/102228, filed on Oct. 14, 2016.

(30) Foreign Application Priority Data

Oct. 27, 2015 (CN) .......................... 2015 1 0740482

(51) Int. Cl.
*H01L 39/06* (2006.01)
*H01L 39/00* (2006.01)
(52) U.S. Cl.
CPC .............. *H01L 39/06* (2013.01); *H01L 39/00* (2013.01); *H01L 39/005* (2013.01)

(58) Field of Classification Search
CPC ....... H01L 39/00; H01L 39/06; H01L 39/005; H01S 3/0903; H01S 3/094; H01S 4/00
See application file for complete search history.

(56) References Cited

PUBLICATIONS

Bingxin Gong, The light controlled fusion, Annals of Nuclear Energy, 2013, pp. 57-60, vol. 62.

*Primary Examiner* — Armando Rodriguez

(57) ABSTRACT

A light-controlled superconductor uses electrons as carriers, which includes a light source and a sealed tube, wherein the sealed tube is made of glass or plastic. The sealed tube is filled with electron gas, and the light source produces incident light, and under the irradiation of the incident light, electrons will be forced to vibrate and behave similarly to vibrating electric dipoles, and emit secondary electromagnetic waves, so that the average distance between the electrons in the sealed tube is much smaller than the wavelength of the incident light, causing the vibrating electrons to be in a near-field of each other. When the electric field intensity direction of the incident light and the electric moments of two vibrating electrons are in the same radial straight line and are in the same direction, there exists an attractive force among the vibrating electrons.

3 Claims, 1 Drawing Sheet

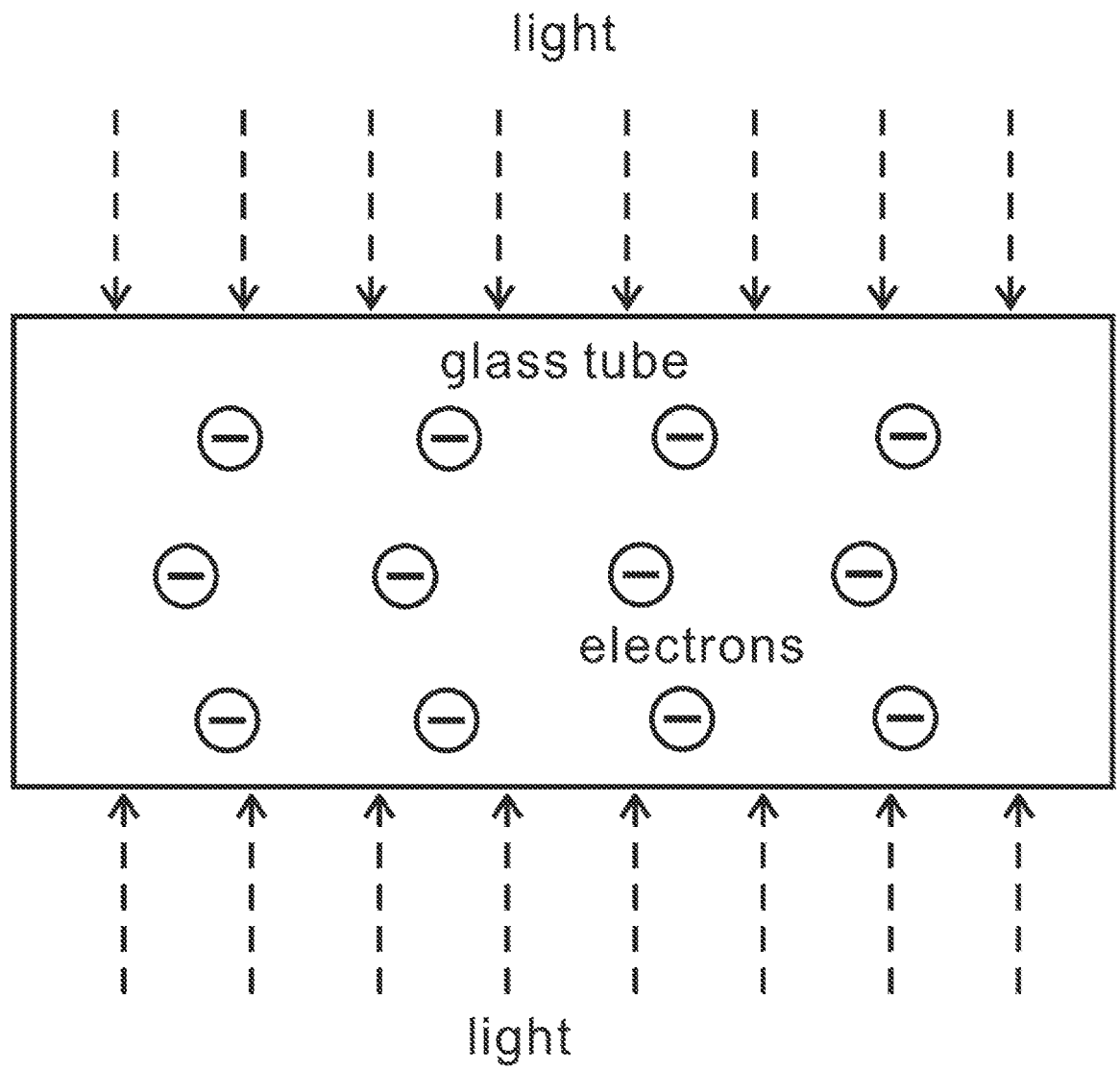

LIGHT-CONTROLLED SUPERCONDUCTOR

TECHNICAL FIELD

This light-controlled superconductor uses electrons as carriers, which includes a light source and a sealed tube, wherein the sealed tube is made of glass or plastic. The sealed tube is filled with electron gas, and the light source produces incident light, and under the irradiation of the incident light, electrons will be forced to vibrate and behave similarly to vibrating electric dipoles, and emit secondary electromagnetic waves, so that the average distance between the electrons in the sealed tube is much smaller than the wavelength of the incident light, causing the vibrating electrons to be in a near-field of each other. When the electric field intensity direction of the incident light and the electric moments of two vibrating electrons are in the same radial straight line and are in the same direction, there exists an attractive force among the vibrating electrons. Such an attractive force reduces the average kinetic energy of the irregular thermal motions of the electrons to nearly zero, so that the resistance of the electron gas is nearly zero, thereby realizing superconductivity. This light-controlled superconductor can also use a nucleus or other charged particles as a carrier.

BACKGROUND ART

It is known that current superconductors require a quite low temperature to enter a superconducting state, and maintaining a quite low temperature will consume considerable energy.

SUMMARY OF INVENTION

The present invention provides a light-controlled superconductor that drops to a quite low temperature when the light-controlled superconductor enters a superconducting state. This light-controlled superconductor uses electrons as carriers, which includes a light source and a sealed tube, wherein the sealed tube is made of glass or plastic. The sealed tube is filled with electron gas, and the light source produces incident light, and under the irradiation of the incident light, electrons will be forced to vibrate and behave similarly to vibrating electric dipoles, and emit secondary electromagnetic waves, so that the average distance between the electrons in the sealed tube is much smaller than the wavelength of the incident light, causing the vibrating electrons to be in a near-field of each other. When the electric field intensity direction of the incident light and the electric moments of two vibrating electrons are in the same radial straight line and are in the same direction, there exists a radial attractive force among the vibrating electrons. Such a radial attractive force reduces the average kinetic energy of the irregular thermal motions of the electrons to nearly zero, so that the resistance of the electron gas is nearly zero, thereby realizing superconductivity. This light-controlled superconductor may also use nucleons or other charged particles as carriers.

This light-controlled superconductor is based on the following principles:

the electrons are negatively charged, and under the irradiation of incident light, the electrons will perform a simple harmonic motion, wherein the simple harmonic motions of the electrons can be considered as vibrating electric dipoles and will emit secondary electromagnetic waves.

When the electric field intensity direction of the incident light and the electric moments of two vibrating electric dipoles are in the same radial straight line and are in the same direction, there exists a mutual-attracting radial acting force among the two vibrating electric dipoles, that is, there exists a mutual-attracting radial acting force among the two vibrating electrons. (Reference document 1).

Assuming that the incident light is produced by a low speed accelerating charge and assuming that the low speed accelerating charge has a charge amount of Q, an amplitude of a, and a frequency of $\omega$, then a radiated electric field of this vibrating electric dipole is $\vec{E}(t)$:

$$\vec{E}(t) = \frac{Qa}{4\pi\varepsilon_0 c^2 R}\omega^2 \cos\omega t \qquad (1)$$

where $\varepsilon_0$ is a vacuum dielectric constant, c is a vacuum light speed, and R is the distance from an observation point to the centre of the vibrating electric dipole.

Let $$A = \frac{Qa}{4\pi\varepsilon_0 c^2 R} \qquad (2)$$

then formula (1) becomes $$\vec{E}(t) = A\omega^2 \cos\omega t \qquad (3)$$

The electric field intensity $\vec{E}(t)$ will cause an electron to be forced to vibrate and behave similarly to a vibrating electric dipole that has a vibration frequency equal to the frequency $\omega$ of the incident light and emits a secondary electromagnetic wave.

Assuming that an electron 1 has a charge amount of $q_e$ and an amplitude of $l_1$, and in a spherical coordinate system, the near-field electric field intensity and the magnetic field intensity of the vibrating electron 1 are respectively:

$$\vec{E_r}(t) = \frac{q_e l_1 \cos\theta}{2\pi\varepsilon_0 r^3}\cos\omega t \vec{r} \qquad (4)$$

$$\vec{E_\theta}(t) = \frac{q_e l_1 \sin\theta}{4\pi\varepsilon_0 r^3}\cos\omega t \vec{\theta} \qquad (5)$$

$$\vec{H_\phi}(t) = \frac{\omega q_e l_1 \sin\theta}{4\pi r^2}\cos(\omega t + \frac{\pi}{2})\vec{\phi} \qquad (6)$$

where r is the distance from an observation point to the centre of the vibrating electron 1, where $r \gg l_1$, $r \ll \lambda$ and $\lambda$ are the wavelength of the incident light.

Assuming that a vibrating electron 2 is at the observation point, the distance between the vibrating electron 1 and the vibrating electron 2 is therefore r. When the electric field intensity $\vec{E}(t)$ is in the direction of $\vec{r}$, $\theta=0$, and formulas (4), (5) and (6) become $$\vec{E_r}(t) = \frac{q_e l_1}{2\pi\varepsilon_0 r^3}\cos\omega t \vec{r} \qquad (7)$$

$$\vec{E_\theta}(t) = 0 \qquad (8)$$

-continued $$\overrightarrow{H_\phi(t)} = 0 \quad (9)$$

The vibrating electron 2 performs a simple harmonic forced vibration under the action of the electric field intensities of $\overrightarrow{E(t)}$ and $\overrightarrow{E_r(t)}$, and has a vibration frequency equal to the frequency $\omega$ of the incident light and will emit a secondary electromagnetic wave. Assuming that the vibrating electron has a mass of $m_e$, a charge amount of $q_e$, and an amplitude of $l_2$, then the motion formula of the vibrating electron 2 in the direction of $\vec{r}$ is:

$$\ddot{x} + \gamma \dot{x} + \omega_0^2 x = q_e A \omega^2 \cos\omega t \vec{r} + \frac{q_e q_e l_1}{2\pi\varepsilon_0 r^3}\cos\omega t \vec{r} \quad (10)$$

where $\omega_0$ is the intrinsic frequency of the vibrating electron 2, and $\gamma$ is a damping coefficient.

$$\gamma = \frac{q_e^2 \omega^2}{6\pi\varepsilon_0 m_e c^3} \quad (11)$$

Because $\tau \ll \omega$, therefore $$x = \frac{q_e}{m_e} \frac{1}{\sqrt{(\omega_0^2 - \omega^2)^2 + \omega^2\gamma^2}}\left(A\omega^2 + \frac{q_e l_1}{2\pi\varepsilon_0 r^3}\right)\cos\omega t \vec{r} = l_2 \cos\omega t \vec{r} \quad (12)$$

$$l_2 = \frac{q_e}{m_e}\frac{1}{\sqrt{(\omega_0^2-\omega^2)^2 + \omega^2\gamma^2}}\left(A\omega^2 + \frac{q_e l_1}{2\pi\varepsilon_0 r^3}\right) \quad (13)$$

Because the vibrating electron 2 can be considered as a vibrating electric dipole, the electric dipole moment of the vibrating electron 2 is defined as $\overrightarrow{P_2}$ and is in the direction of $\vec{r}$. Then, $$\vec{p}_2 = q_e l_2 \cos\omega t \vec{r} \quad (14)$$
$$= \frac{q_e^2}{m_e}\frac{1}{\sqrt{(\omega_0^2-\omega^2)^2+\omega^2\gamma^2}}\left(A\omega^2+\frac{q_e l_1}{2\pi\varepsilon_0 r^3}\right)\cos\omega t \vec{r}$$

The electric field intensity $\overrightarrow{E(t)}$ does not depend on the distance r, and therefore will not exert a force in the direction of $\vec{r}$ on the vibrating electron 2.

The near-field electric field intensity $\overrightarrow{E_r(t)}$ of the vibrating electron 1 will exert a force $F_N$ in the direction of $\vec{r}$ on the vibrating electron 2, and the electric field intensity $\overrightarrow{E(t)}$ and the electric moments of the vibrating electron 1 and the vibrating electron 2 are along the line $\vec{r}$ and are in the same direction.

$$F_N = q_e l_2 \cos\omega t (\vec{r} \cdot \nabla \overrightarrow{E_r(t)}) = \overrightarrow{P_2} \cdot \nabla \overrightarrow{E_r(t)} \quad (15)$$

where $$\nabla = \vec{r}\frac{\partial}{\partial r}.$$

$$F_N = \frac{1}{\sqrt{(\omega_0^2-\omega^2)^2+\omega^2\gamma^2}}\left(\frac{3Aq_e^2 q_e l_1\omega^2\cos^2\omega t}{4m_e\pi\varepsilon_0 r^4} + \frac{3q_e^2}{8m_e}\frac{q_e^2 l_1^2\cos^2\omega t}{\pi^2\varepsilon_0^2 r^7}\right)\vec{r} \quad (16)$$

From formula (16), it can be known that there exists an attractive force $F_N$ in the direction of $\vec{r}$ between the vibrating electron 1 and the vibrating electron 2 in the near-field.

There exists a Coulomb repulsive force $F_C$ between the electron 1 and the electron 2:

$$F_C = \frac{q_e^2}{4\pi\varepsilon_0 r^2}\vec{r} \quad (17)$$

In a rectangular coordinate system, the attractive force $F_N$ between the vibrating electron 1 and the vibrating electron 2 is expressed as:

$$F_{Nx} = F_N \sin\theta\cos\phi\vec{x} \quad (18)$$

$$F_{Ny} = F_N \sin\theta\sin\phi\vec{y} \quad (19)$$

$$F_{Nz} = F_N \cos\theta\vec{z} \quad (20)$$

In a rectangular coordinate system, the Coulomb repulsive force $F_C$ between the electron 1 and the electron 2 is expressed as:

$$F_{Cx} = F_C \sin\theta\cos\phi\vec{x} \quad (21)$$

$$F_{Cy} = F_C \sin\theta\sin\phi\vec{y} \quad (22)$$

$$F_{Cz} = F_C \cos\theta\vec{z} \quad (23)$$

Because electrons are quite small, the electrons can be regarded as mass points, and except the moment of collision, the interaction between electrons is negligible, and the electron gas can be considered as an ideal gas, therefore, there is a following relation for the pressure intensity P:

$$P = m_e \sum_i n_i V_{ix}^2 = nk_B T \quad (24)$$

where P is the pressure intensity, n is the total number of electrons, $m_e$ is an electron mass, $k_B$ is the Boltzmann constant, T is the absolute temperature, $n_i$ is the number of electrons that have a velocity between $V_i$ and $V_i + dV_i$, and $V_{ix}$ is the X-axis component of $V_i$.

Because $$\frac{dP}{dT} = \frac{dP}{dt}\cdot\frac{dt}{dT} = nk_B \quad (25)$$

$$\frac{dP}{dt} = 2m_e\sum_i n_i V_{ix}\frac{dV_{ix}}{dt} \quad (26)$$

-continued $$\frac{dV_{ix}}{dt} = \frac{F_x}{m_e} \quad (27)$$

therefore, there is $$\frac{dP}{dt} = 2\sum_i n_i V_{ix} F_x \quad (28)$$

$$\frac{dT}{dt} = \frac{2\sum_i n_i V_{ix} F_x}{nk_B} \quad (29)$$

$$F_x = F_{Nx} + F_{Cx} \quad (30)$$

$$= \frac{q_e^2}{4\pi\varepsilon_0 r^2}\sin\theta\cos\phi - \frac{1}{\sqrt{(\omega_0^2-\omega^2)^2+\omega^2\gamma^2}}$$

$$\left(\frac{3Aq_e^2 q_e l_1 \omega^2}{4m_e\pi\varepsilon_0 r^4} + \frac{3q_e^2}{8m_e}\frac{q_e^2 l_1^2}{\pi^2\varepsilon_0^2 r^7}\right)\sin\theta\cos\phi\cos^2\omega t$$

A, $\omega$, and $n_d$ can all be controlled, $$r \sim n_d^{-\frac{1}{3}} \quad (31)$$

where $n_d$ is the electron number density.

For example, when $\omega = 10^{14}$ Hz, $A = 10^{-13}$ N·S²/C, $A\omega^2 = 10^{15}$ N/C, $\lambda = 1.884 \times 10^{-5}$ m, $r = 10^{-10}$ m and $l_1 = 10^{-15}$ m, there is $$\frac{3Aq_e^2 q_e l_1 \omega^2}{4m_e\pi\varepsilon_0 r^4} \gg \frac{3q_e^2}{8m_e}\frac{q_e^2 l_1^2}{\pi^2\varepsilon_0^2 r^7} \quad (32)$$

Because apart from the moment of collision, the interaction between electrons is negligible, this means that the electrons are approximately free electrons, and $\omega_0 \approx 0$ When $\omega \gg \omega_0$, $$F_x \approx \frac{q_e^2}{4\pi\varepsilon_0 r^2}\sin\theta\cos\phi - \frac{3Aq_e^2 q_e l_1}{4m_e\pi\varepsilon_0 r^4}\sin\theta\cos\phi\cos^2\omega t \quad (33)$$

$$\int_{V_{ix0}}^{V_{ix}} dV_{ix} = \frac{1}{m_e}\int_0^t F_x dt \quad (34)$$

$$\int_{P_0}^{P} dP = 2\sum_i n_i V_{ix} \int_0^t F_x dt \quad (35)$$

$$\int_{T_0}^{T} dT = \frac{2\sum_i n_i V_{ix}}{nk_B}\int_0^t F_x dt \quad (36)$$

By integrating formulas (34), (35) and (36), because $$\int_0^t \cos^2\omega t\, dt = \frac{1}{\omega}\left(\frac{\omega t}{2}+\frac{1}{4}\sin 2\omega t\right) \approx \frac{t}{2} \quad (37)$$

$$V_{ix}-V_{ix0} = \frac{1}{m_e}\left(\frac{q_e^2 t}{4\pi\varepsilon_0 r^2}\sin\theta\cos\phi - \frac{3Aq_e^2 q_e l_1 t}{8m_e\pi\varepsilon_0 r^4}\sin\theta\cos\phi\right) \quad (38)$$

-continued $$P - P_0 = 2\sum_i n_i V_{ix}\left(\frac{q_e^2 t}{4\pi\varepsilon_0 r^2}\sin\theta\cos\phi - \frac{3Aq_e^2 q_e l_1 t}{8m_e\pi\varepsilon_0 r^4}\sin\theta\cos\phi\right) \quad (39)$$

$$T - T_0 = \frac{2\sum_i n_i V_{ix}}{nk_B}\left(\frac{q_e^2 t}{4\pi\varepsilon_0 r^2}\sin\theta\cos\phi - \frac{3Aq_e^2 q_e l_1 t}{8m_e\pi\varepsilon_0 r^4}\sin\theta\cos\phi\right) \quad (40)$$

When $\omega = 10^{14}$ HZ, $A = 10^{-13}$ N·S²/C, $r = 10^{-10}$ m and $l_1 = 10^{-15}$ m, there is $$\frac{3Aq_e l_1}{2m_e r^2} > 1 \quad (42)$$

$$V_{ix} - V_{ix0} < 0 \quad (43)$$

$$P - P_0 < 0 \quad (44)$$

$$T - T_0 < 0 \quad (45)$$

The pressure and temperature of the electron gas will drop, and the average kinetic energy of the thermal motions of the electrons will also decrease.

When $$t = V_{ix0} \Big/ \frac{1}{m_e}\left(\frac{3Aq_e^2 q_e l_1}{8m_e\pi\varepsilon_0 r^4}\sin\theta\cos\phi - \frac{q_e^2}{4\pi\varepsilon_0 r^2}\sin\theta\cos\phi\right) \quad (46)$$

there is $$V_{ix}=0, P=0, T=0 \quad (47)$$

Because $$V_x^2 = \frac{\sum_i n_i V_{ix}^2}{n} \quad (48)$$

therefore, there is $$V_x = 0 \quad (49)$$

Similarly, there is $$V_y = 0 \quad (50)$$

$$V_z = 0 \quad (51)$$

When the irregular microscopic velocity and resistance of the electrons drop to nearly zero, the electrons will no longer collide with each other and will no longer hit the wall of the sealed tube.

When the velocity of the electrons drops to nearly zero, because the attractive force $F_N$ is greater than the Coulomb repulsive force $F_C$, the distance between the electrons decreases until the attractive force $F_N$ equals to the coulomb repulsive force $F_C$, and at this time, the electrons will move in a straight line without collision and resistance, and the resistance decreases to nearly zero.

When the irregular microscopic velocity and resistance of the electrons drop to nearly zero, the external electric field intensity E will give the electrons an initial velocity $V_e$, and because the resistance is nearly zero, $V_e$ will not decrease, and the electrons will form a persistent current with a superconducting current density of J, where $$J = nq_e V_e \quad (52)$$

Electrons of which a motion velocity direction is parallel to the magnetic induction intensity B have no magnetic moment.

$V_\perp$ is the velocity component of the motion velocity direction that is perpendicular to the magnetic induction intensity B, $V_\perp$ causes the electrons to perform a uniform circular motion, and the magnetic moment of the electrons is $p_m$ where $$p_m = \frac{q_e V_\perp r_c}{q_e B} \quad (53)$$

where $r_c$ is the radius of the uniform circular motion, $$r_c = \frac{m_e V_\perp}{q_e B} \quad (54)$$

The magnetization intensity M the vector sum of the magnetic moments of electrons per unit volume.

$$M = \frac{\sum p_m}{V} \quad (55)$$

where $\Sigma p_m$ is the vector sum of the magnetic moments of electrons in the volume V.

Because $$M = \frac{\mu_r - 1}{\mu_0 \mu_r} B \quad (56)$$

where $\mu_r$ is a relative magnetic permeability, and $\mu_0$ is an absolute magnetic permeability.

Therefore, there is $$\frac{\mu_r - 1}{\mu_0 \mu_r} B = \frac{\sum \frac{q_e V_\perp r_c}{2}}{V} \quad (57)$$

When $$V_\perp = 0, T = 0, P = 0 \quad (58)$$

there is $$B = 0 \quad (59)$$

This means that when the electron gas transitions from a normal state to a superconducting state, the magnetic field is repelled from the interior of the electron gas.

According to the above principle of the light-controlled superconductor, the sealed tube is evacuated first to remove impurities in the sealed tube, so that the pressure intensity in the sealed tube is less than 1 $P_a$, and then the electron gas is injected, and when the electron gas is injected, the electron gas is first irradiated with a low-frequency electromagnetic wave, and the electron gas is then irradiated with a high-frequency electromagnetic wave, so that the attractive force among vibrating electrons becomes greater, and the average distance between the electrons in the sealed tube becomes smaller. The sealed tube is made of glass or plastic, and the sealed tube is wrapped with a heat insulation material outside.

After the sealed tube is filled with the electron gas, the average distance between electrons in the sealed tube is much smaller than the wavelength of incident light, and an electron number density is much greater than the negative third power of the wavelength of the incident light, so that vibrating electrons are in a near-field of each other; the light source produces the incident light, and the electrons are irradiated with the incident light, so that an attractive force is produced between the vibrating electrons; the radial attractive force among the vibrating electrons is controlled by controlling the charge amount and amplitude of an accelerating charge that produces the incident light and the distance between the light source and the vibrating electrons, so that the average kinetic energy of the thermal motions of the electrons decreases to nearly zero, and the resistance of the electron gas is nearly zero, and the electron gas transitions from a normal state to a superconducting state to realize superconductivity; the electron number density is controlled by controlling the frequency of the incident light, thereby controlling a superconducting current density; it is also possible to use nucleons or other charged particles as carriers for the light-controlled superconductor.

BRIEF DESCRIPTION OF THE DRAWINGS

The accompanying drawings are presented to aid in the description of embodiments of the invention and are provided solely for illustration of the embodiments and not limitation thereof.

The FIGURE shows a diagram illustrating the light-controlled superconductor according to an embodiment of the present invention.

DETAILED DESCRIPTION OF EMBODIMENTS

A specific embodiment is described below, but specific implementations are not limited to this example.

Please refer to the FIGURE showing the light-controlled superconductor according to an embodiment of the present invention. If there is air in a sealed tube, the thermal kinetic energy of molecules in the air will affect the transition of an electron gas from a normal state to a superconducting state, therefore, the sealed tube needs to be evacuated first, so that the pressure in the sealed tube is lower than 1 $P_a$. After the evacuation, the electron gas is injected, and in order to allow the vibrating electrons to be in a near-field of each other, the average distance between electrons in the sealed tube should be much smaller than the wavelength of incident light, $r \ll \lambda$. Because there is the following relationship between the average distance r between electrons and a particle number density $n_d$:

$$r \sim n_d^{-\frac{1}{3}} \quad (31)$$

Therefore, there is the following relationship between the particle number density $n_d$ and the wavelength $\lambda$ of the incident light:

$$n_d \gg \lambda^{-\frac{1}{3}} \quad (60)$$

That is, the third power of the particle number density is much greater than the wavelength of the incident light. A required particle number density can be known from the wavelength of the incident light.

Because electrons are produced from gas ionization, a hydrogen molecule contains 2 electrons, and there are $6.023 \times 10^{23}$ hydrogen molecules per mole of hydrogen, the number of moles of hydrogen that need to be ionized can be known from the wavelength of the incident light.

The sealed tube is made of glass or plastic, and the sealed tube is wrapped with a heat insulation material outside to prevent the electron gas from absorbing heat to change from the superconducting state to the normal state.

When the electron gas is injected, the electron gas is first irradiated with a low-frequency electromagnetic wave, and the electron gas is then irradiated with a high-frequency electromagnetic wave, so that the attractive force among vibrating electrons becomes greater, and the average distance between the electrons in the sealed tube becomes smaller.

From formulas (2) and (16), it can be seen that the attractive force $F_N$ between the vibrating electrons increases with the increase of A and ω and increases with the decrease of the distance r, and A increases with the increase of Q and A increases with the decrease of R. Therefore, controlling the charge amount Q and amplitude a of an accelerating charge that produces the incident light and the distance R can control the radial attractive force among the vibrating electrons, thereby controlling the average kinetic energy of the thermal motions of the electrons to realize superconductivity.

At the same time, it can be known according to formula (54) that the electron number density is controlled by controlling the frequency of the incident light, thereby controlling a superconducting current density. This light-controlled superconductor may also use nucleons or other charged particles as carriers.

REFERENCE DOCUMENTS

1,
BingXin Gong, 2013, The light controlled fusion, Annals of Nuclear Energy, 62 (2013), 57-60.

What is claimed is:

1. A light-controlled superconductor, wherein the light-controlled superconductor uses electrons as carriers, which comprises a light source and a sealed tube, wherein the sealed tube is made of glass or plastic and is filled with electron gas; the average distance between electrons in the sealed tube is much smaller than the wavelength of incident light, and an electron number density is much greater than the negative third power of the wavelength of the incident light, so that vibrating electrons are in a near-field of each other; the light source produces the incident light, and the electrons are irradiated with the incident light, so that an attractive force is produced between the vibrating electrons; the radial attractive force among the vibrating electrons is controlled by controlling the charge amount and amplitude of an accelerating charge that produces the incident light and the distance between the light source and the vibrating electrons, so that the average kinetic energy of the thermal motions of the electrons decreases to nearly zero, and the resistance of the electron gas is nearly zero, and the electron gas transitions from a normal state to a superconducting state to realize superconductivity; the electron number density is controlled by controlling the frequency of the incident light, thereby controlling a superconducting current density.

2. The light-controlled superconductor according to claim 1, wherein the sealed tube is evacuated first to remove impurities in the sealed tube, so that a pressure intensity in the sealed tube is less than 1 $P_a$, and then the electron gas is injected; and when the electron gas is injected, the electron gas is first irradiated with a low-frequency electromagnetic wave, the electron gas is then irradiated with a high-frequency electromagnetic wave, so that the attractive force among the vibrating electrons becomes greater, and the average distance between the electrons in the sealed tube becomes smaller; the sealed tube is made of glass or plastic, and the sealed tube is wrapped with a heat insulation material outside.

3. The light-controlled superconductor according to claim 1, wherein the carriers are nucleons or charged particles other than electrons instead of the electrons.

* * * * *